(12) United States Patent
Pugh et al.

(10) Patent No.: US 9,703,120 B2
(45) Date of Patent: Jul. 11, 2017

(54) METHODS AND APPARATUS FOR AN OPHTHALMIC LENS WITH FUNCTIONAL INSERT LAYERS

(71) Applicant: Johnson & Johnson Vision Care, Inc., Jacksonville, FL (US)

(72) Inventors: Randall B. Pugh, Jacksonville, FL (US); Frederick A. Flitsch, New Windsor, NY (US); Daniel B. Otts, Fruit Cove, FL (US); James Daniel Riall, St. Johns, FL (US); Adam Toner, Jacksonville, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 0 days.

(21) Appl. No.: 14/577,797

(22) Filed: Dec. 19, 2014

(65) Prior Publication Data

US 2015/0212339 A1 Jul. 30, 2015

Related U.S. Application Data

(62) Division of application No. 13/401,952, filed on Feb. 22, 2012, now Pat. No. 8,950,862.

(60) Provisional application No. 61/447,469, filed on Feb. 28, 2011, provisional application No. 61/454,205, filed on Mar. 18, 2011.

(51) Int. Cl.
*G02C 7/04* (2006.01)
*G02C 7/08* (2006.01)
(Continued)

(52) U.S. Cl.
CPC ........ *G02C 7/083* (2013.01); *B29D 11/00028* (2013.01); *B29D 11/00807* (2013.01);
(Continued)

(58) Field of Classification Search
CPC ........ G02C 11/10; G02C 7/083; G02C 7/101; G02C 7/022; G02C 7/04; G02C 7/041;
(Continued)

(56) References Cited

U.S. PATENT DOCUMENTS 754,804 A 3/1904 Pratt
787,657 A 4/1905 Back
(Continued)

FOREIGN PATENT DOCUMENTS

CN 102196789 A 9/2011
CN 102727218 A 10/2012
(Continued)

OTHER PUBLICATIONS

Pandey, J.; Yu-Te Liao; Lingley, A.; Mirjalili, R.; Parviz, B.; Otis, B.P., "A Fully Integrated RF-Powered Contact Lens With a Single Element Display," Biomedical Circuits and Systems, IEEE Transactions on, vol. 4, No. 6, pp. 454,461, Dec. 2010.
(Continued)

*Primary Examiner* — Jordan Schwartz

(57) ABSTRACT

This invention discloses a media substrate for incorporation into ophthalmic lenses that has been formed by the stacking of multiple functionalized layers. Additionally, methods and apparatus for providing a stacked functional layer insert for incorporation into an ophthalmic lens are also provided. In some embodiments, an ophthalmic lens is cast molded from a silicone hydrogel and the lens includes at least one stacked functional layer insert portion.

11 Claims, 6 Drawing Sheets

(51) Int. Cl.

| | | |
|---|---|---|
| *B29D 11/00* | (2006.01) | |
| *G02C 7/10* | (2006.01) | |
| *G02C 7/02* | (2006.01) | |
| *G02C 11/00* | (2006.01) | |

(52) U.S. Cl.
CPC ........ *B29D 11/00817* (2013.01); *G02C 7/021* (2013.01); *G02C 7/022* (2013.01); *G02C 7/046* (2013.01); *G02C 7/049* (2013.01); *G02C 7/101* (2013.01); *G02C 11/10* (2013.01); *G02C 2202/16* (2013.01); *Y10T 428/24752* (2015.01)

(58) Field of Classification Search
CPC ................ G02C 7/049; G02C 2202/16; B29D 11/00807; B29D 11/00817; B29D 11/00028
See application file for complete search history.

(56) References Cited

U.S. PATENT DOCUMENTS

| | | |
|---|---|---|
| 3,291,296 A | 12/1966 | Lemkelde |
| 3,375,136 A | 3/1968 | Biggar |
| 4,268,132 A | 5/1981 | Neefe |
| 4,592,944 A | 6/1986 | Clark et al. |
| 4,601,545 A | 7/1986 | Kern |
| 4,921,728 A | 5/1990 | Takiguchi et al. |
| 5,219,497 A | 6/1993 | Blum |
| 5,478,420 A | 12/1995 | Gauci et al. |
| 5,596,567 A | 1/1997 | deMuro et al. |
| 5,600,180 A | 2/1997 | Kusaka et al. |
| 5,682,210 A | 10/1997 | Weirich |
| 5,712,721 A | 1/1998 | Large |
| 6,217,171 B1 | 4/2001 | Auten et al. |
| 6,322,589 B1 | 11/2001 | Cumming |
| 6,355,501 B1 | 3/2002 | Fung et al. |
| 6,364,482 B1 | 4/2002 | Roffman et al. |
| 6,477,410 B1 | 11/2002 | Henley et al. |
| 6,599,778 B2 | 7/2003 | Pogge et al. |
| 6,638,304 B2 | 10/2003 | Azar |
| 6,852,254 B2 | 2/2005 | Spaulding et al. |
| 6,924,036 B2 | 8/2005 | Polastri et al. |
| 7,404,636 B2 | 7/2008 | Blum et al. |
| 7,410,700 B2 | 8/2008 | Wang |
| 7,548,040 B2 | 6/2009 | Lee et al. |
| 7,755,583 B2 | 7/2010 | Meredith |
| 7,794,643 B2 | 9/2010 | Watanabe et al. |
| 7,798,301 B2 | 9/2010 | Keating et al. |
| 7,876,573 B2 | 1/2011 | Motohara et al. |
| 8,343,216 B2 | 1/2013 | Brady et al. |
| 8,579,435 B2 | 11/2013 | Blum et al. |
| 8,857,983 B2 | 10/2014 | Pugh et al. |
| 8,950,862 B2 | 2/2015 | Pugh et al. |
| 9,102,111 B2 | 8/2015 | Pugh et al. |
| 9,110,310 B2 | 8/2015 | Pugh et al. |
| 9,134,546 B2 | 9/2015 | Pugh et al. |
| 9,195,075 B2 | 11/2015 | Pugh et al. |
| 9,233,513 B2 | 1/2016 | Pugh et al. |
| 9,296,158 B2 | 3/2016 | Pugh et al. |
| 2002/0041027 A1 | 4/2002 | Sugizaki |
| 2002/0058151 A1 | 5/2002 | Uchikoba et al. |
| 2002/0162631 A1 | 11/2002 | Wien et al. |
| 2003/0002160 A1 | 1/2003 | Johnson et al. |
| 2003/0021601 A1 | 1/2003 | Goldstein |
| 2003/0069666 A1 | 4/2003 | Nagler |
| 2003/0137922 A1 | 7/2003 | Ro et al. |
| 2004/0000732 A1 | 1/2004 | Spaulding et al. |
| 2004/0027536 A1 | 2/2004 | Blum et al. |
| 2004/0084790 A1 | 5/2004 | Blum et al. |
| 2004/0131925 A1 | 7/2004 | Jenson et al. |
| 2004/0239874 A1 | 12/2004 | Swab et al. |
| 2005/0036109 A1 | 2/2005 | Blum et al. |
| 2005/0099594 A1 | 5/2005 | Blum et al. |
| 2005/0185135 A1 | 8/2005 | Blum et al. |
| 2005/0231677 A1 | 10/2005 | Meredith |
| 2005/0255079 A1 | 11/2005 | Santerre et al. |
| 2006/0001137 A1 | 1/2006 | Hundt et al. |
| 2006/0026201 A1 | 2/2006 | Cabillic |
| 2006/0095128 A1 | 5/2006 | Blum et al. |
| 2006/0152912 A1 | 7/2006 | Karrer et al. |
| 2006/0181676 A1 | 8/2006 | Tucker et al. |
| 2006/0202359 A1 | 9/2006 | Chen |
| 2006/0226556 A1 | 10/2006 | Kurita et al. |
| 2006/0255441 A1 | 11/2006 | Ohta |
| 2006/0265058 A1 | 11/2006 | Silvestrini |
| 2006/0267167 A1 | 11/2006 | McCain |
| 2007/0052876 A1* | 3/2007 | Kaufman ................ G02B 3/14 349/13 |
| 2007/0090869 A1 | 4/2007 | Adewole et al. |
| 2007/0128420 A1 | 6/2007 | Maghribi |
| 2007/0159562 A1 | 7/2007 | Haddock et al. |
| 2007/0231575 A1 | 10/2007 | Watanabe et al. |
| 2007/0242171 A1 | 10/2007 | Mori |
| 2007/0242173 A1 | 10/2007 | Blum et al. |
| 2007/0285385 A1 | 12/2007 | Albert et al. |
| 2008/0002149 A1 | 1/2008 | Fritsch et al. |
| 2008/0020127 A1 | 1/2008 | Whiteford et al. |
| 2008/0020874 A1 | 1/2008 | Huang et al. |
| 2008/0024858 A1 | 1/2008 | Kaufman et al. |
| 2008/0042227 A1 | 2/2008 | Asano et al. |
| 2008/0058652 A1 | 3/2008 | Payne |
| 2008/0079396 A1 | 4/2008 | Yamazaki et al. |
| 2008/0086206 A1 | 4/2008 | Nasiatka et al. |
| 2008/0101267 A1 | 5/2008 | Kurokawa |
| 2008/0208335 A1 | 8/2008 | Blum et al. |
| 2008/0212007 A1 | 9/2008 | Meredith |
| 2008/0261390 A1 | 10/2008 | Chen et al. |
| 2009/0002012 A1 | 1/2009 | Doong et al. |
| 2009/0003383 A1 | 1/2009 | Watanabe et al. |
| 2009/0033863 A1 | 2/2009 | Blum et al. |
| 2009/0046349 A1 | 2/2009 | Haddock et al. |
| 2009/0050267 A1 | 2/2009 | Conlon et al. |
| 2009/0079641 A1 | 3/2009 | Cruzado et al. |
| 2009/0091818 A1 | 4/2009 | Haddock et al. |
| 2009/0105817 A1 | 4/2009 | Bretthauer et al. |
| 2009/0175016 A1 | 7/2009 | Legen et al. |
| 2009/0182426 A1 | 7/2009 | Von Arx et al. |
| 2009/0204207 A1 | 8/2009 | Blum et al. |
| 2009/0204454 A1 | 8/2009 | Lagudi |
| 2009/0243125 A1 | 10/2009 | Pugh et al. |
| 2009/0244477 A1 | 10/2009 | Pugh et al. |
| 2009/0256977 A1 | 10/2009 | Haddock et al. |
| 2009/0269392 A1* | 10/2009 | Tauber ................ A61K 9/0092 424/429 |
| 2009/0278503 A1 | 11/2009 | Hundt et al. |
| 2010/0001926 A1 | 1/2010 | Amirparviz et al. |
| 2010/0002190 A1 | 1/2010 | Clarke et al. |
| 2010/0072643 A1 | 3/2010 | Pugh et al. |
| 2010/0073534 A1 | 3/2010 | Yano et al. |
| 2010/0076553 A1* | 3/2010 | Pugh ................ B29D 11/00038 623/6.22 |
| 2010/0078838 A1 | 4/2010 | Pugh et al. |
| 2010/0079724 A1 | 4/2010 | Pugh et al. |
| 2010/0103368 A1 | 4/2010 | Amirparviz et al. |
| 2010/0103369 A1 | 4/2010 | Pugh et al. |
| 2010/0109175 A1 | 5/2010 | Pugh et al. |
| 2010/0110372 A1* | 5/2010 | Pugh ................ B29D 11/00009 351/159.75 |
| 2010/0295135 A1* | 11/2010 | Masuoka ............ H01L 27/0886 257/390 |
| 2011/0007656 A1 | 1/2011 | He et al. |
| 2011/0045112 A1 | 2/2011 | Pugh et al. |
| 2011/0074281 A1 | 3/2011 | Farquhar et al. |
| 2011/0076567 A1 | 3/2011 | Bouillon |
| 2011/0076568 A1 | 3/2011 | Bouillon |
| 2011/0174431 A1 | 7/2011 | Darmes et al. |
| 2011/0230963 A1 | 9/2011 | Cuevas |
| 2011/0284912 A1 | 11/2011 | Sekine et al. |
| 2012/0024295 A1 | 2/2012 | Mihin |
| 2012/0057244 A1 | 3/2012 | Pugh et al. |
| 2012/0092612 A1 | 4/2012 | Binder |
| 2012/0100412 A1 | 4/2012 | Kwon et al. |
| 2012/0162600 A1 | 6/2012 | Pugh et al. |

(56) References Cited

U.S. PATENT DOCUMENTS

| | | |
|---|---|---|
| 2012/0218508 A1 | 8/2012 | Pugh et al. |
| 2012/0234453 A1 | 9/2012 | Pugh et al. |
| 2012/0235277 A1 | 9/2012 | Pugh et al. |
| 2012/0236254 A1 | 9/2012 | Pugh et al. |
| 2012/0236524 A1 | 9/2012 | Pugh et al. |
| 2012/0242953 A1 | 9/2012 | Pugh et al. |
| 2012/0245444 A1 | 9/2012 | Otis et al. |
| 2012/0259188 A1 | 10/2012 | Besling |
| 2013/0019540 A1 | 1/2013 | Magnus |
| 2013/0024575 A1 | 1/2013 | Taylor |
| 2013/0194540 A1 | 8/2013 | Pugh et al. |
| 2013/0215380 A1 | 8/2013 | Pugh et al. |
| 2013/0245754 A1 | 9/2013 | Blum et al. |
| 2013/0245755 A1 | 9/2013 | Fehr et al. |
| 2014/0148899 A1 | 5/2014 | Fehr et al. |
| 2014/0036226 A1 | 6/2014 | Blum et al. |
| 2014/0306361 A1 | 10/2014 | Pugh et al. |
| 2015/0212339 A1 | 7/2015 | Pugh et al. |
| 2015/0309337 A1 | 10/2015 | Flitsch et al. |
| 2015/0323811 A1 | 11/2015 | Flitsch et al. |
| 2015/0378176 A1 | 12/2015 | Flitsch et al. |

FOREIGN PATENT DOCUMENTS

| | | |
|---|---|---|
| DE | 19858172 A1 | 6/2000 |
| DE | 102007048859 A1 | 4/2009 |
| EP | 1262307 A2 | 12/2002 |
| EP | 1736291 A2 | 12/2006 |
| EP | 1747879 A2 | 1/2007 |
| EP | 1736291 A3 | 3/2007 |
| EP | 1747879 A3 | 3/2007 |
| EP | 1760515 A2 | 3/2007 |
| EP | 1849574 A2 | 10/2007 |
| EP | 1849589 A2 | 10/2007 |
| EP | 1342560 B1 | 7/2008 |
| EP | 1849589 A3 | 3/2009 |
| EP | 1262307 B1 | 2/2010 |
| EP | 1760515 A3 | 8/2011 |
| JP | 1286809 A | 11/1989 |
| JP | 10209185 A | 8/1998 |
| JP | 200128036 | 1/2001 |
| JP | 2007-313594 | 12/2007 |
| JP | 2007313594 A | 12/2007 |
| JP | 2008227068 A | 9/2008 |
| JP | 201034254 | 2/2010 |
| TW | 200532278 A | 10/2005 |
| WO | WO 9423334 A1 | 10/1994 |
| WO | WO 03090611 | 11/2003 |
| WO | WO 03090611 A1 | 11/2003 |
| WO | WO 2004015460 A2 | 2/2004 |
| WO | WO 2004015460 A3 | 6/2004 |
| WO | WO 2005088388 A1 | 9/2005 |
| WO | WO 2006050171 A2 | 5/2006 |
| WO | WO 2006077192 A1 | 7/2006 |
| WO | WO 2006050171 A2 | 9/2006 |
| WO | WO 2006115649 A2 | 11/2006 |
| WO | WO 2007050402 A2 | 5/2007 |
| WO | WO 2006115649 A3 | 6/2007 |
| WO | WO 2007081959 A2 | 7/2007 |
| WO | WO 2008010390 A1 | 1/2008 |
| WO | WO 2007081959 A3 | 5/2008 |
| WO | WO 2008091859 A1 | 7/2008 |
| WO | WO 2008103906 A2 | 8/2008 |
| WO | WO 2008109867 A2 | 9/2008 |
| WO | WO 2008109867 A3 | 10/2008 |
| WO | WO 2008103906 A3 | 11/2008 |
| WO | WO 2007050402 A3 | 3/2009 |
| WO | WO 2009038897 A2 | 3/2009 |
| WO | WO 2009038897 A3 | 6/2009 |
| WO | WO 2009105261 | 8/2009 |
| WO | WO 2009105261 A1 | 8/2009 |
| WO | WO 2009113296 A1 | 9/2009 |
| WO | WO 2009117506 A2 | 9/2009 |
| WO | WO 2009117506 A3 | 1/2010 |
| WO | WO 2010033679 A2 | 3/2010 |
| WO | WO 2010033683 | 3/2010 |
| WO | WO 2010033683 A1 | 3/2010 |
| WO | WO 2010039610 A2 | 4/2010 |
| WO | WO 2010051203 A1 | 5/2010 |
| WO | WO 2010051225 A1 | 5/2010 |
| WO | WO 2010033679 A3 | 6/2010 |
| WO | WO 2010051225 A9 | 6/2010 |
| WO | WO 2010039610 A3 | 7/2010 |
| WO | WO 2010082993 A2 | 7/2010 |
| WO | WO 2010082993 A3 | 9/2010 |
| WO | WO 2010133317 A1 | 11/2010 |
| WO | WO 2011083105 A1 | 7/2011 |
| WO | WO 2010133317 A9 | 10/2011 |
| WO | WO 2011163080 A1 | 12/2011 |
| WO | WO 2012018583 A1 | 2/2012 |

OTHER PUBLICATIONS

Loy, M., et al., "ISM-Band and Short Range Device Antennas", Texas Instruments Application Report, Aug. 2005. Online: http://www.ti.com/lit/answra046a/.

Pandey, J., et al. "Toward an Active Contact Lens: Integration of a Wireless Power Harvesting IC", Dept. of Elect. Eng., University of Washington, Seattle, WA, USA. Biomedical Circuits and Systems Conference, 2009. BioCAS 2009. IEEE Issue Date: Nov. 26-28, 2009 pp. 125-128 online: http:/wireless.ee.washington.edu/papers/biocas2009 inpyudodpo.pdf.

Parviz, B., "Augmented Reality in a Contact Lens", IEEE Spectrum, Sep. 2009. Online: http:/spectrum.ieee.org/biomedical/bionics/augmented-reality-in-a-contact- -lens/O.

Williams, A. "Swiss Startup Puts MEMS Sensor in Contact Lens", Electronics Weekly.com, Mar. 25, 2010, 9:29 AM online: http://www.electronicsweekly.com/blogs/uk-technology-startups/2010/03/swi-ss-startup-puts-mems-sensor.tml.

Davies, C., "Opto-Electronic Contact Lenses Promise Wireless Displays", Nov. 25, 2009. Online: http://www.slashgear.com/opto-electronic-contact-lenses-promise-wireless-- displays-2564454/.

Orca, Surfdaddy, "Micro Machines and Opto-Electronics on a Contact Lens", Nov. 20, 2009. Online: http://www.hplusmagazine.com/arraicles/toys-tools/micro-machines-and-opto- -electortncis-contact-lense.

Parviz, Babak, A., "Augmented Reality in a Contact Lens, A New Generation of Contact Lenses Built With Very Small Circuits and LEDs Promises Bionic Eyesight", IEEE Spectrum.org/biomedical/bionics, downloaded Jul. 10, 2012.

Gosalia K.,: "Novel Compact Antennas for Biomedical Implants and Wireless Applications", PhD Dissertation, North Carolina State University, 2004, [retrieved from internet on Dec. 22, 2014]: URL> http://repository.lib.ncsu.edu/ir/bitstream/1840.16/4508/1/etd.pdf?origin=publication_detail.

Ratta, Varun "Crystallization, Morphology, Thermal Stability and Adhesive Properties of Novel High Performance Semicrystalline Polyimides" PhD Dissertation defended Apr. 26, 1999 Virginia Tech University, entire Chapter 4.

PCT International Search Report, dated Oct. 2, 2012 for PCT Int'l Appln. No. PCT/US2012/029769.

European Search Report for Application No. EP 13 15 6410 Date of Completion of Report Jun. 5, 2013.

Singapore Search Report for corresponding Application No. SG-201300387-6 dated Apr. 7, 2013.

PCT International Search Report, dated Dec. 23, 2009, for PCT Int'l Appln. No. PCT/US2009/057289.

PCT International Search Report dated May 4, 2010, for PCT Int'l Appln. No. PCT/US2009/057284.

International Search Report for PCT PCT/US2012/026849 Date of Jul. 2, 2012.

Singapore Written Opinion Date of Written Opinion Mar. 31 2015 for Application No. 11201404171Y.

\* cited by examiner

METHODS AND APPARATUS FOR AN OPHTHALMIC LENS WITH FUNCTIONAL INSERT LAYERS

RELATED APPLICATIONS

This application is a divisional application of U.S. Non-Provisional application Ser. No. 13/401,952, filed on Feb. 22, 2012, which claims priority to U.S. Provisional Application Ser. No. 61/447,469, filed Feb. 28, 2011, and also to U.S. Provisional Application Ser. No. 61/454,205, filed Mar. 18, 2011. The contents of each of these applications are incorporated herein by reference.

FIELD OF USE

This invention describes a functionalized insert for an ophthalmic device formed from multiple functional layers which are stacked, as well as, in some embodiments, methods and apparatus for the fabrication of an ophthalmic lens with a functionalized insert of multiple stacked layers.

BACKGROUND

Traditionally an ophthalmic device, such as a contact lens, an intraocular lens or a punctal plug included a biocompatible device with a corrective, cosmetic or therapeutic quality. A contact lens, for example, can provide one or more of: vision correcting functionality; cosmetic enhancement; and therapeutic effects. Each function is provided by a physical characteristic of the lens. A design incorporating a refractive quality into a lens can provide a vision corrective function. A pigment incorporated into the lens can provide a cosmetic enhancement. An active agent incorporated into a lens can provide a therapeutic functionality. Such physical characteristics are accomplished without the lens entering into an energized state. A punctal plug has traditionally been a passive device.

More recently, it has been theorized that active components may be incorporated into a contact lens. Some components can include semiconductor devices. Some examples have shown semiconductor devices embedded in a contact lens placed upon animal eyes. It has also been described how the active components may be energized and activated in numerous manners within the lens structure itself. The topology and size of the space defined by the lens structure creates a novel and challenging environment for the definition of various functionality. Generally, such disclosures have included discrete devices. However, the size and power requirements for available discrete devices are not necessarily conducive for inclusion in a device to be worn on a human eye.

SUMMARY

Accordingly, the present invention includes designs of components that may make an insert that can be energized and incorporated into an ophthalmic device. The insert can be formed of multiple layers which may have unique functionality for each layer; or alternatively mixed functionality but in multiple layers. The layers may in some embodiments have layers dedicated to the energization of the product or the activation of the product or for control of functional components within the lens body. In addition, methods and apparatus for forming an ophthalmic lens, with inserts of stacked functionalized layers are presented.

In some embodiments, the insert may contain a layer in an energized state which is capable of powering a component capable of drawing a current. Components may include, for example, one or more of: a variable optic lens element, and a semiconductor device, which may either be located in the stacked layer insert or otherwise connected to it. Some embodiments can also include a cast molded silicone hydrogel contact lens with a rigid or formable insert of stacked functionalized layers contained within the ophthalmic lens in a biocompatible fashion.

Accordingly, the present invention includes a disclosure of an ophthalmic lens with a stacked functionalized layer portion, apparatus for forming an ophthalmic lens with a stacked functionalized layer portion and methods for the same. An insert may be formed from multiple layers in various manners as discussed herein and the insert can be placed in proximity to one, or both of, a first mold part and a second mold part. A reactive monomer mix is placed between the first mold part and the second mold part. The first mold part is positioned proximate to the second mold part thereby forming a lens cavity with the energized media substrate and at least some of the reactive monomer mix in the lens cavity; the reactive monomer mix is exposed to actinic radiation to form an ophthalmic lens. Lenses may be formed via the control of actinic radiation to which the reactive monomer mixture is exposed.

DETAILED DESCRIPTION OF THE INVENTION

Figure 1:
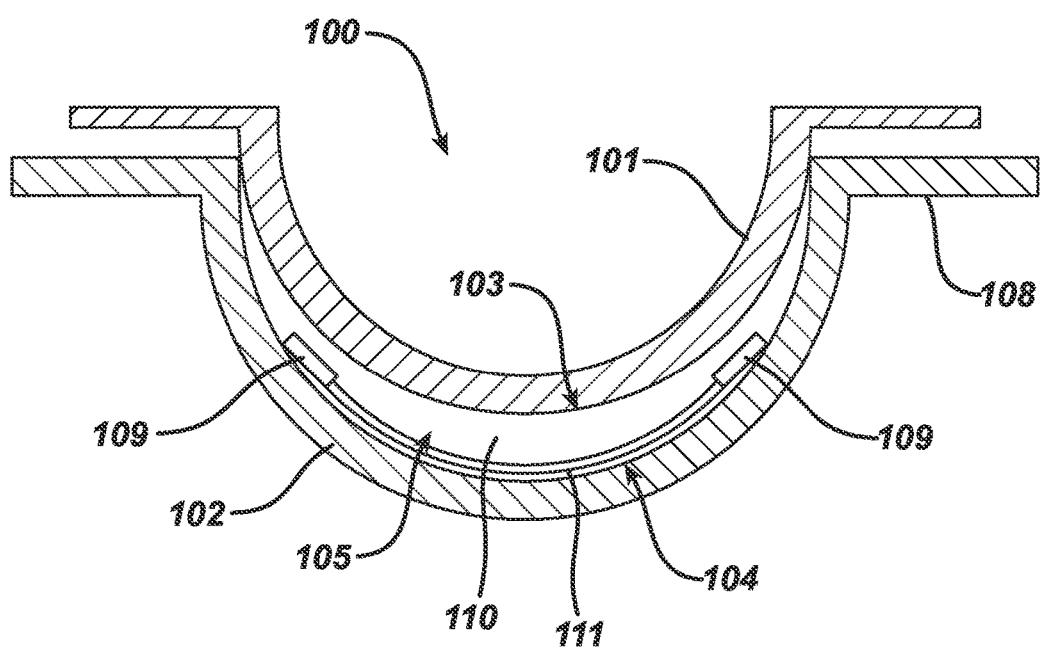
FIG. 1 illustrates a mold assembly apparatus according to previously described embodiments.

The present invention includes a media substrate device formed through the stacking of multiple functionalized layers. Additionally the present invention also includes the methods and apparatus for manufacturing an ophthalmic lens with such a stacked functionalized layer media substrate. In addition, the present invention includes an ophthalmic lens with a stacked functionalized layer media substrate incorporated into the ophthalmic lens.

In the following sections detailed descriptions of embodiments of the invention will be given. The description of both preferred and alternative embodiments are exemplary embodiments only, and it is understood that to those skilled in the art that variations, modifications and alterations may be apparent. It is therefore to be understood that said exemplary embodiments do not limit the scope of the underlying invention.

Glossary

In this description and claims directed to the presented invention, various terms may be used for which the following definitions will apply:

Energized: as used herein refers to the state of being able to supply electrical current to or to have electrical energy stored within.

Energy: as used herein refers to the capacity of a physical system to do work. Many uses within this invention may relate to the said capacity being able to perform electrical actions in doing work.

Energy Source: as used herein refers to device capable of supplying Energy or placing a biomedical device in an Energized state.

Energy Harvesters: as used herein refers to device capable of extracting energy from the environment and convert it to electrical energy.

Functionalized: as used herein refers to making a layer or device able to perform a function including for example, energization, activation, or control.

Lens: refers to any ophthalmic device that resides in or on the eye. These devices can provide optical correction or may be cosmetic. For example, the term lens can refer to a contact lens, intraocular lens, overlay lens, ocular insert, optical insert or other similar device through which vision is corrected or modified, or through which eye physiology is cosmetically enhanced (e.g. iris color) without impeding vision. In some embodiments, the preferred lenses of the invention are soft contact lenses are made from silicone elastomers or hydrogels, which include but are not limited to silicone hydrogels, and fluorohydrogels.

Lens forming mixture or "Reactive Mixture" or "RMM" (reactive monomer mixture): as used herein refers to a monomer or prepolymer material which can be cured and crosslinked or crosslinked to form an ophthalmic lens. Various embodiments can include lens forming mixtures with one or more additives such as: UV blockers, tints, photoinitiators or catalysts, and other additives one might desire in an ophthalmic lenses such as, contact or intraocular lenses.

Lens Forming Surface: refers to a surface that is used to mold a lens. In some embodiments, any such surface 103-104 can have an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

Lithium Ion Cell: refers to an electrochemical cell where Lithium ions move through the cell to generate electrical energy. This electrochemical cell, typically called a battery, may be reenergized or recharged in its typical forms.

Media substrate: as used herein refers to a formable or rigid substrate capable of supporting an Energy Source within an ophthalmic lens. IN some embodiments, the Media substrate also supports one or more components.

Mold: refers to a rigid or semi-rigid object that may be used to form lenses from uncured formulations. Some preferred molds include two mold parts forming a front curve mold part and a back curve mold part.

Optical Zone: as used herein refers to an area of an ophthalmic lens through which a wearer of the ophthalmic lens sees.

Power: as used herein refers to work done or energy transferred per unit of time.

Rechargeable or Re-energizable: as used herein refers to a capability of being restored to a state with higher capacity to do work. Many uses within this invention may relate to the capability of being restored with the ability to flow electrical current at a certain rate for a certain, reestablished time period.

Reenergize or Recharge: To restore to a state with higher capacity to do work. Many uses within this invention may relate to restoring a device to the capability to flow electrical current at a certain rate for a certain, reestablished time period.

Released from a mold: means that a lens is either completely separated from the mold, or is only loosely attached so that it can be removed with mild agitation or pushed off with a swab.

Stacked: as used herein means to place at least two component layers in proximity to each other such that at least a portion of one surface of one of the layers contacts a first surface of a second layer. In some embodiments, a film, whether for adhesion or other functions may reside between the two layers that are in contact with each other through said film.

Description

An energized lens 100 with an embedded Media substrate 111 may include an Energy Source 109, such as an electrochemical cell or battery as the storage means for the energy and in some embodiments, encapsulation and isolation of the materials comprising the Energy Source from an environment into which an ophthalmic lens is placed.

In some embodiments, a Media substrate also includes a pattern of circuitry, components and Energy Sources 109. Various embodiments can include the Media substrate locating the pattern of circuitry, components and Energy Sources 109 around a periphery of an optic zone through which a wearer of a lens would see, while other embodiments can include a pattern of circuitry, components and Energy Sources 109 which are small enough to not adversely affect the sight of a contact lens wearer and therefore the Media substrate can locate them within, or exterior to, an optical zone.

In general, according to these embodiments previously described, a Media substrate 111 is embodied within an ophthalmic lens via automation which places an Energy Source a desired location relative to a mold part used to fashion the lens.

Molds

Referring now to FIG. 1, a diagram of an exemplary mold 100 for an ophthalmic lens is illustrated with a Media substrate 111. As used herein, the terms a mold includes a form 100 having a cavity 105 into which a lens forming mixture 110 can be dispensed such that upon reaction or cure of the lens forming mixture, an ophthalmic lens of a desired shape is produced. The molds and mold assemblies 100 of this invention are made up of more than one "mold parts" or "mold pieces" 101-102. The mold parts 101-102 can be brought together such that a cavity 105 is formed between the mold parts 101-102 in which a lens can be formed. This combination of mold parts 101-102 is preferably temporary. Upon formation of the lens, the mold parts 101-102 can again be separated for removal of the lens.

At least one mold part 101-102 has at least a portion of its surface 103-104 in contact with the lens forming mixture such that upon reaction or cure of the lens forming mixture 110 that surface 103-104 provides a desired shape and form to the portion of the lens with which it is in contact. The same is true of at least one other mold part 101-102.

Thus, for example, in a preferred embodiment a mold assembly 100 is formed from two parts 101-102, a female concave piece (front piece) 102 and a male convex piece (back piece) 101 with a cavity formed between them. The portion of the concave surface 104 which makes contact with lens forming mixture has the curvature of the front curve of an ophthalmic lens to be produced in the mold assembly 100 and is sufficiently smooth and formed such that the surface of an ophthalmic lens formed by polymerization of the lens forming mixture which is in contact with the concave surface 104 is optically acceptable.

In some embodiments, the front mold piece 102 can also have an annular flange integral with and surrounding circular circumferential edge 108 and extends from it in a plane normal to the axis and extending from the flange (not shown).

A lens forming surface can include a surface 103-104 with an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

At 111, a Media substrate is illustrated onto which an Energy Source 109 may be placed. The Media substrate 111 may be any receiving material onto which an Energy Source 109 may be placed, in some embodiments may also include circuit paths, components and other aspects useful to use of the energy source. In some embodiments, the Media substrate 111 can be a clear coat of a material which be incorporated into a lens when the lens is formed. The clear coat can include for example a pigment as described below, a monomer or other biocompatible material. Additional embodiments can include a media comprising an insert, which can be either rigid or formable. In some embodiments, a rigid insert may include an optical zone providing an optical property (such as those utilized for vision correction) and a non-optical zone portion. An Energy Source can be placed on one or both of the optic zone and non-optic zone of the insert. Still other embodiments can include an annular insert, either rigid or formable or some shape which circumvents an optic zone through which a user sees.

Various embodiments also include placing an Energy Source 109 onto Media substrate 111 prior to placement of the Media substrate 111 into a mold portion used to form a lens. The Media substrate 111 may also include one or more components which will receive an electrical charge via the Energy Source 109.

In some embodiments, a lens with a Media substrate 111 can include a rigid center soft skirt design in which a central rigid optical element is in direct contact with the atmosphere and the corneal surface on respective an anterior and posterior surfaces, wherein the soft skirt of lens material (typically a hydrogel material) is attached to a periphery of the rigid optical element and the rigid optical element also acts as a Media substrate providing energy and functionality to the resulting ophthalmic lens.

Some additional embodiments include a Media substrate 111 that is a rigid lens insert fully encapsulated within a hydrogel matrix. A Media substrate 111 which is a rigid lens insert may be manufactured, for example using microinjection molding technology. Embodiments can include, for example, a poly(4-methylpent-1-ene copolymer resin with a diameter of between about 6 mm to 10 mm and a front surface radius of between about 6 mm and 10 mm and a rear surface radius of between about 6 mm and 10 mm and a center thickness of between about 0.050 mm and 0.5 mm. Some exemplary embodiments include an insert with diameter of about 8.9 mm and a front surface radius of about 7.9 mm and a rear surface radius of about 7.8 mm and a center thickness of about 0.100 mm and an edge profile of about 0.050 radius. One exemplary micromolding machine can include the Microsystem 50 five-ton system offered by Battenfield Inc.

The Media substrate can be placed in a mold part 101-102 utilized to form an ophthalmic lens.

Mold part 101-102 material can include, for example: a polyolefin of one or more of: polypropylene, polystyrene, polyethylene, polymethyl methacrylate, and modified polyolefins. Other molds can include a ceramic or metallic material.

A preferred alicyclic co-polymer contains two different alicyclic polymers and is sold by Zeon Chemicals L.P. under the trade name ZEONOR. There are several different grades of ZEONOR. Various grades may have glass transition temperatures ranging from 105° C. to 160° C. A specifically preferred material is ZEONOR 1060R.

Other mold materials that may be combined with one or more additives to form an ophthalmic lens mold include, for example, Zieglar-Natta polypropylene resins (sometimes referred to as znPP). On exemplary Zieglar-Natta polypropylene resin is available under the name PP 9544 MED. PP 9544 MED is a clarified random copolymer for clean molding as per FDA regulation 21 CFR (c) 3.2 made available by ExxonMobile Chemical Company. PP 9544 MED is a random copolymer (znPP) with ethylene group (hereinafter 9544 MED). Other exemplary Zieglar-Natta polypropylene resins include: Atofina Polypropylene 3761 and Atofina Polypropylene 3620WZ.

Still further, in some embodiments, the molds of the invention may contain polymers such as polypropylene, polyethylene, polystyrene, polymethyl methacrylate, modified polyolefins containing an alicyclic moiety in the main chain and cyclic polyolefins. This blend can be used on either or both mold halves, where it is preferred that this blend is used on the back curve and the front curve consists of the alicyclic co-polymers.

In some preferred methods of making molds 100 according to the present invention, injection molding is utilized according to known techniques, however, embodiments can also include molds fashioned by other techniques including, for example: lathing, diamond turning, or laser cutting.

Stacked Functionalized Layer Inserts

Figure 2:
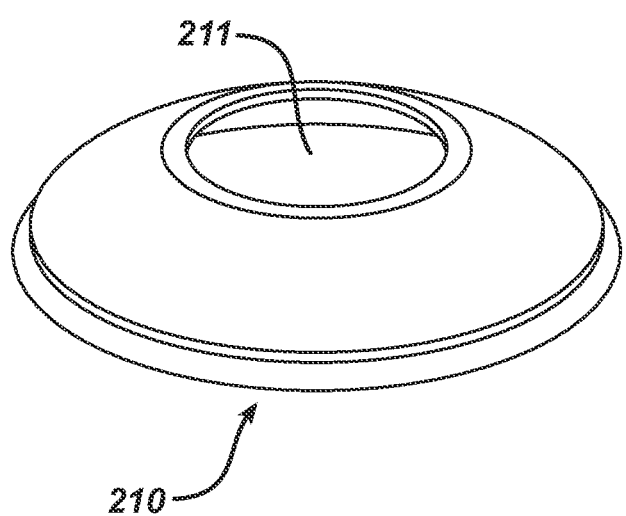
FIG. 2 illustrates an exemplary embodiment of an exemplary form factor for an insert which can be placed within an ophthalmic lens.

Referring now to FIG. 2, an exemplary design of one embodiment of a Media substrate 111 which has been formed as a Stacked Functionalized Layer Insert is illustrated. This invention relates to novel methods to prepare and form the media substrate that may be utilized and formed into Ophthalmic Lenses in manners consistent with the previously described art. For clarity of description, but not limiting the scope of the claimed invention, an exemplary Media substrate 210 is illustrated and described, which comprises a full annular ring with an optical lens area 211. It may be obvious to one skilled in the arts that the inventive art described in this specification has similar application to the various diversity of shapes and embodiments that have been described generically for Media substrates of various kinds.

Figure 3:
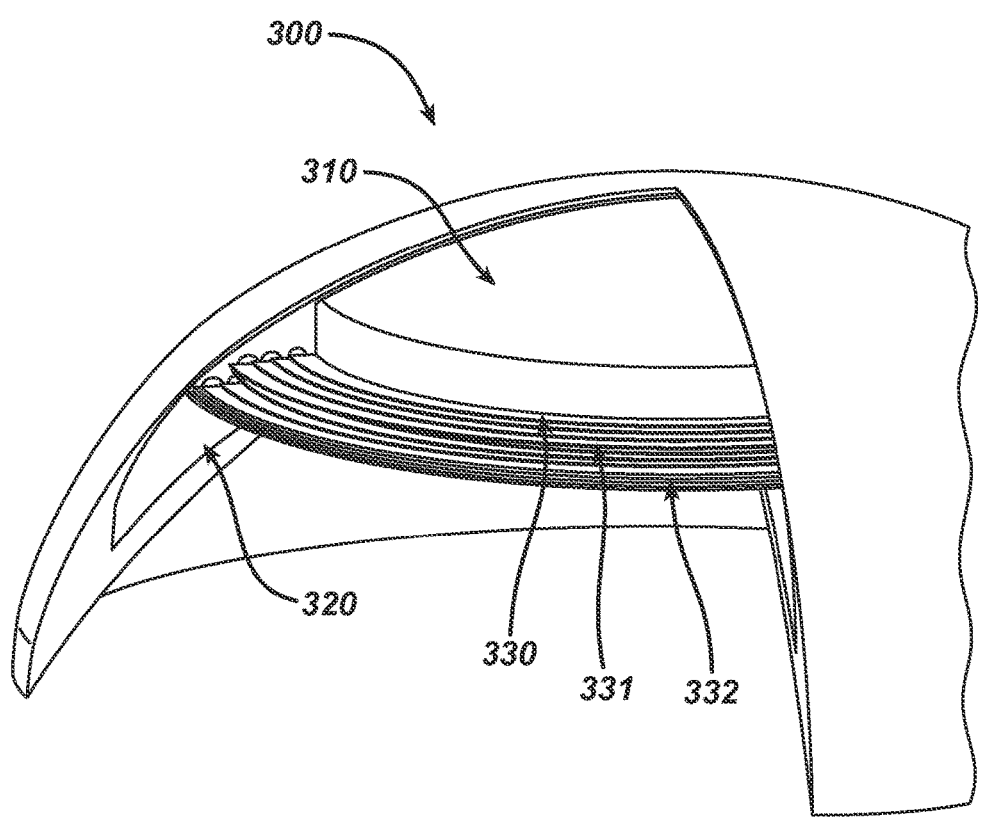
FIG. 3 illustrates a three dimensional representation of an insert formed of stacked functional layers which is incorporated within an ophthalmic lens mold part.

Referring now to FIG. 3 a three dimensional representation is illustrated of some embodiments of a fully formed ophthalmic lens using a stacked layer media substrate of the time in item 210 is demonstrated as item 300. The representation shows a partial cut out from the ophthalmic lens to realize the different layers present inside the device. Item 320 shows the body material in cross section of the encapsulating layers of the media substrate. This item surrounds the entire periphery of the ophthalmic lens as can be envisioned for an insert of the type in item 210. It may be clear to one skilled in the arts that the actual insert may comprise a full annular ring or other shapes that still may reside within the constraints of the size of a typical ophthalmic lens.

Items 330, 331 and 332 are meant to illustrate three of numerous layers that may be found in a media substrate formed as a stack of functional layers. In some embodiments, a single layer may include one or more of: active and passive components and portions with structural, electrical or physical properties conducive to a particular purpose.

In some embodiments, a layer 330 may include an energization source, such as, for example, one or more of: a battery, a capacitor and a receiver within the layer 330. Item 331 then, in a non limiting exemplary sense may comprise microcircuitry in a layer that detects actuation signals for the ophthalmic lens. In some embodiments, a power regulation layer 332, may be included that is capable of receiving power from external sources, charges the battery layer 330 and controls the use of battery power from layer 330 when the lens is not in a charging environment. The power regulation may also control signals to an exemplary active lens, demonstrated as item 310 in the center annular cutout of the media substrate, identified as 211 in FIG. 2.

Figure 4:
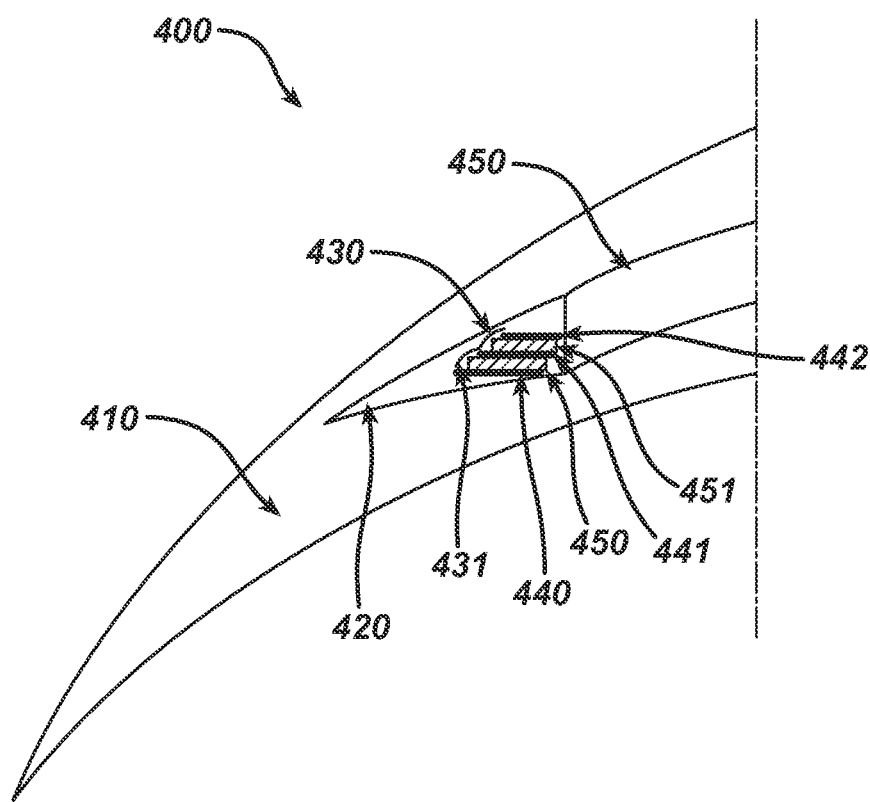
FIG. 4 illustrates a cross sectional representation of an ophthalmic lens mold part with an insert.

FIG. 4 illustrates a closer view of some embodiments of a stacked functional layer insert 400 seen in cross section. Within the body of the ophthalmic lens 410 is embedded the functionalized layer insert 420 which surrounds and connects to an active lens component 450, in some embodiments. It may be clear to one skilled in the arts, that this example shows but one of numerous embodiments of embedded function that may be placed within an ophthalmic lens.

Within the stacked layer portion of the insert are demonstrated numerous layers. In some embodiments the layers may comprise multiple semiconductor based layers. For example, item 440, the bottom layer in the stack, may be a thinned silicon layer upon which circuits have been defined for various functions. Another thinned silicon layer may be found in the stack as item 441. In a non-limiting example, such a layer may have the function of energization of the device. These silicon layers will in some embodiments be electrically isolated from each other through an intervening insulator layer show as item 450. The portions of the surface layers of items 440, 450 and 441 that overlap each other may be adhered to each other through the use of a thin film of adhesive. It may be obvious to one skilled in the arts that numerous adhesives may have the desired characteristics to adhere and passivate the thin silicon layers to the insulator, as in an exemplary sense an epoxy might.

A multiple stacked layer may include additional layers 442, which in a non limiting example may include a thinned silicon layer with circuitry capable of activating and controlling an active lens component. As mentioned before, when the stacked layers need to be electrically isolated from each other, stacked insulator layers may be included between the electrically active layer and in this example item 451 may represent this insulator layer comprising part of the stacked layer insert. In some of the examples described herein, reference has been made to layers formed from thin layers of silicon. The general art may be extended to different embodiments where the material definitions of the thin stacked layers include, in a non limiting sense, other semiconductors, metals or composite layers. The function of the thin layers may include electrical circuitry, but also may include other functions like signal reception, energy handling and storage and energy reception to mention a few examples. In some embodiments that include different material types, the choice of different adhesives, encapsulants and other materials which interact with the stacked layers may be required. In an example embodiment, a thin layer of epoxy may adhere three silicon layers shown as 440, 441 and 442 with two silicon oxide layers 450 and 451.

As mentioned in some of the examples the thinned stacked layer may comprise circuits formed into silicon layers. There may be numerous manners to fabricate such layers, however, standard and state of the art semiconductor processing equipment may form electronic circuits on silicon wafers using generic processing steps. After the circuits are formed into the appropriate locations on the silicon wafers, wafer processing equipment may be used to thin the wafers from hundreds of microns thick to thicknesses of 50 microns or less. After thinning the silicon circuits may be cut or "diced" from the wafer into the appropriate shapes for the ophthalmic lens or other application. In later section, different exemplary shapes of the stacked layer invention disclosed herein are shown in FIG. 6. These will be discussed in detail later; however, the "dicing" operation may use various technical options to cut out thin layers with curved, circular, annular, rectilinear and other more complicated shapes.

When the stacked layers perform a function relating to electrical current flow, in some embodiments, there may be a need to provide electrical contact between the stacked layers. In the general field of semiconductor packaging this electrical connection between stacked layers has generic solutions comprising wire bonding, solder bumping, through silicon vias and wire deposition processes. Some embodiments of wire deposition may use printing process where electrically conductive inks are printed between two connection pads. In other embodiments, wires may be physically defined by an energy source, like for example a laser, interacting with a gaseous, liquid or solid chemical intermediate resulting in an electrical connection where the energy source irradiates. Still further interconnection definition embodiments may derive from photolithographic processing before or after metal films are deposited by various means.

In the invention herein, if one or more of the layers needs to communicate electrical signals outside itself, it may have a metal contact pad that is not covered with passivating and insulating layers. In many embodiments these pads would be located on the periphery of the layer where subsequent stacked layers do not cover the region. In an example of this type of embodiment, in FIG. 4 interconnect wires 430 and 431 are demonstrated as electrically connecting peripheral regions of layers 440, 441 and 442. It may be apparent to one skilled in the art that numerous layouts or designs of where the electrical connection pads are located and the manner of electrically connecting various pads together. Furthermore, it may be apparent that different circuit designs may derive from the choice of which electrical connect pads are connected and to which other pads they are connected. Still further, the function of the wire interconnection between pads may be different in different embodiments including the functions of electrical signal connection, electrical signal reception from external sources, electrical power connection and mechanical stabilization to mention a few examples.

In a previous discussion, it was presented that non semiconductor layers may comprise one or more of the stacked layers in the inventive art. It may be apparent that there could be a great diversity of applications which may derive from nonsemiconductor layers. In some embodiments, the layers may define energizing sources like batteries. This type of layer in some cases may have a semiconductor acting as the supporting substrate for the chemical layers, or in other embodiments may have metallic or insulating substrates. Other layers may derive from layers which are primarily metallic in nature. These layers may define antennas, thermal conductive paths, or other functions. There may be numerous combinations of semiconducting and non semiconducting layers that comprise useful application within the spirit of the inventive art herein.

In some embodiments where electrical connection is made between stacked layers the electrical connection will need to be sealed after connection is defined. There are numerous methods that may be consistent with the art herein. For example, the epoxy or other adherent materials used to hold the various stacked layers together could be reapplied to the regions with electrical interconnect. Additionally, passivation films may, in some embodiments, be deposited across the entire device to encapsulate the regions that were used for interconnection. It may be apparent to one skilled in the art that numerous encapsulating and sealing schemes may be useful within this art to protect, strengthen and seal the stacked layer device and its interconnections and interconnection regions.

Assembling Stacked Functionalized Layer Inserts

Figure 5:
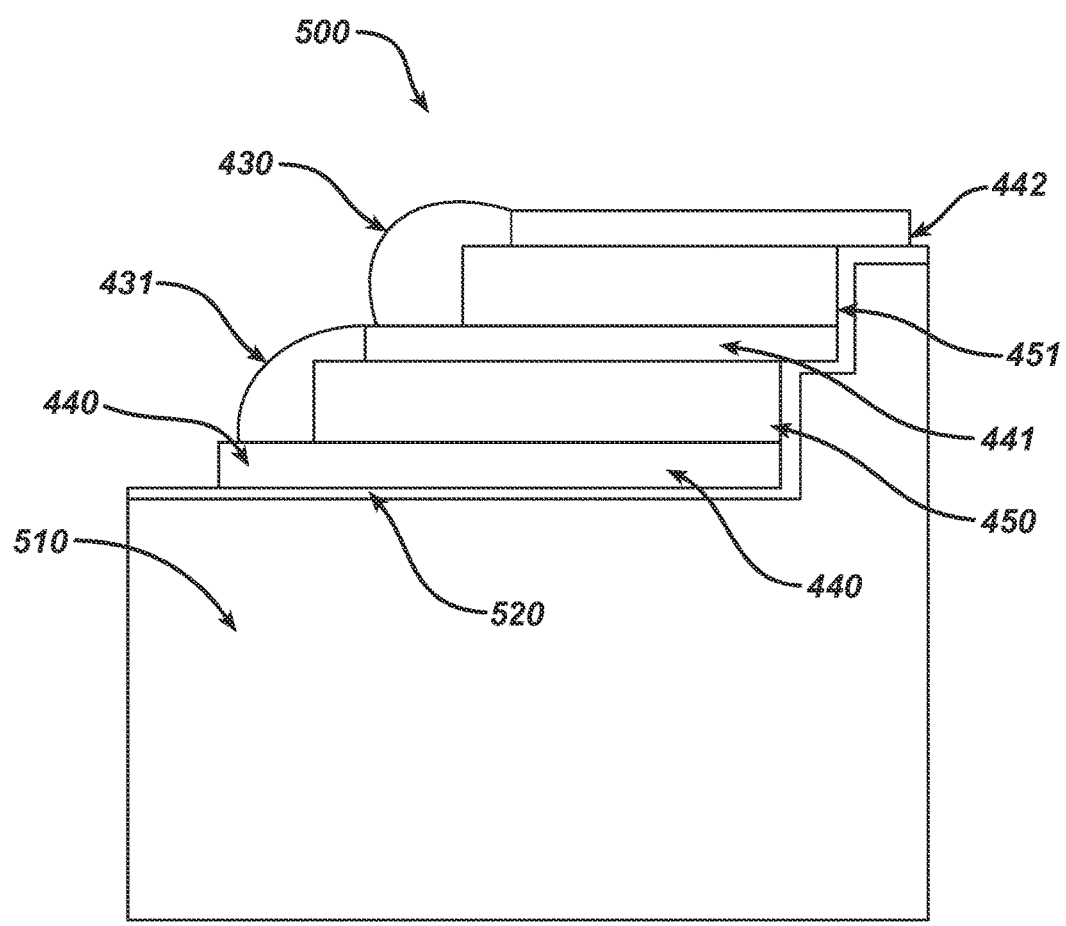
FIG. 5 demonstrates an exemplary embodiment of an insert comprising multiple stacked functional layers upon a supporting and aligning structure.

Proceeding to FIG. 5, item 500, a close up view of an exemplary apparatus to assemble stacked functionalized layer inserts is demonstrated. In the example, a stacking technique where the stacked layers do not align on either side of the layer is shown. Items 440, 441 and 442 again may be silicon layers. On the right side of the Fig. it can be seen that the right side edge of the items 440, 441 and 442 do not align with each other, as they may in alternative embodiments. Such a stacking methodology may allow the insert to assume a three dimensional shape similar to that of the general profile of an ophthalmic lens. In some embodiments as well, such a stacking technique may allow for the layers to be made from the largest surface area as possible. In layers that are functional for energy storage and circuitry such surface area maximization may be important.

In general many of the features of the previously described stacked inserts may be observed in FIG. 5 including stacked functional layers 440, 441 and 442; stacked insulating layers 450 and 451; and interconnections 430 and 431, the interconnections may include a through silicon via. Additionally a supporting jig, item 510, may be observed to support the stacked functionalized layer insert as it is being assembled. It may be apparent that the surface profile of item 510 may assume a large number of shapes which will change the three dimensional shape of inserts made thereon.

In general, a jig 510 may be provided with a predetermined shape. It may be coated with different layers, item 520, for a number of purposes. In a non limiting exemplary sense, the coating may first comprise a polymer layer that will allow easy incorporation of an insert into the base material of an ophthalmic lens, and may even be formed from a polysilicone material in some embodiments. An epoxy coating may then be deposited upon the polysilicone coating to adhere the bottom thin functional layer 440 to the coating 520. The bottom surface of a next insulating layer 450 may then be coated with a similar epoxy coating and then placed into its appropriate location upon the jig. It may be clear that the jig may in some embodiments have the function of aligning the correct placement of the stacked layers relative to each other as the device is assembled. In repetitious fashion, the rest of the insert may then be assembled, the interconnections defined and then the insert encapsulated. In some embodiments, the encapsulated insert may then be coated from the top with a polysilicone coating. In some embodiments that use a polysilicone coating for item 520, the assembled insert may be dissociated from the jig 510 by hydration of the polysilicone coating.

The jig 510 may be formed from numerous materials. In some embodiments, the jig may be formed and made of similar materials that are used to make molding pieces in the manufacture of standard contact lenses. Such a use could support the flexible formation of various jig types for different insert shapes and designs. In other embodiments the jig may be formed from materials that either in their own right or with special coatings will not adhere to the chemical mixtures used to adhere the different layers to each other. It may be apparent that numerous options may exist for the configuration of such a jig.

Another aspect of the jig demonstrated as item 510 is the fact that its shape physically supports the layers upon it. In some embodiments the interconnection between the layers may be formed by wirebonding connection. In the process of wirebonding significant force is applied the wire to ensure it forms a good bond. Structural support of the layers during such bonding could be important and could be performed by the supporting jig 510.

Still another function of the jig demonstrated as item 510 is that the jig may have alignment features on it that allow for the alignment of pieces of the functionalized layers to be aligned both relative to each other linearly and radially along the surfaces. In some embodiments, the jig may allow the alignment of azimutal angle of the functional layers relative to each other around a center point. Regardless of the ultimate shape of the insert produced it may be apparent that the assembly jib may be useful in insuring that the pieces of the insert are properly aligned for their function and correct interconnection.

Proceeding to FIGS. 6A-6D, a more generalized discussion of shapes of stacked layer inserts may be had. In a subset of the generality of shapes consistent with the art, some sample variation in shape is shown. For example, referring to FIG. 6A, item 610 shows a top view of a stacked insert which has been formed from essentially circular layer pieces. In some embodiments, the region shown with cross hatching 611 may be an annular region where layer material has been removed. However, in other embodiments, it may be apparent that the pieces of the stacked layers used form the insert could be disks without an annular region. Although, such a non annular insert shape may be of limited utility in an ophthalmic application the spirit of the inventive art herein is not intended to be limited by the presence of an internal annulus.

Figure 6A:
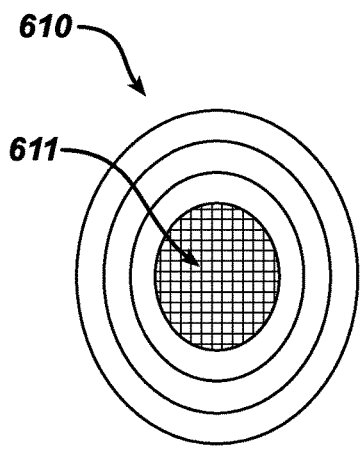
FIGS. 6A-6D illustrate different shapes and embodiments of the components used for forming layers in a stacked functional layer insert.
Figure 6B:
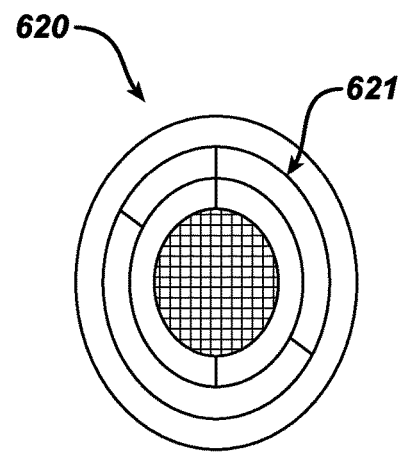

Proceeding to FIG. 6B, item 620 may in some embodiments demonstrate different embodiments of a stacked functional layer insert. As shown in item 621, in some embodiments the layer pieces may be discrete not only in the stacking direction but also around the azimuthal direction perpendicular to the stacking direction. In some embodiments, semicircular pieces may be used to form the insert. It may be apparent that in shapes that have an annular region, which partial shapes could be useful to reduce the amount of material that would need to be "diced" or cut out after the layer material is formed into its function.

Figure 6C:
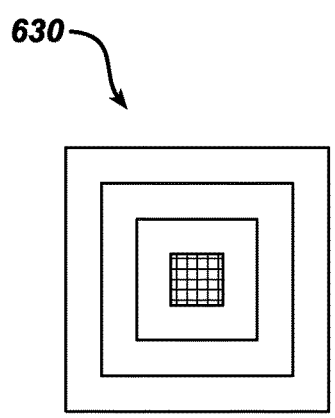
Figure 6D:
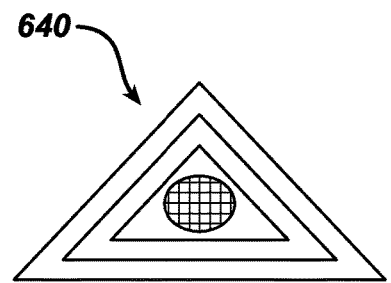

Proceeding further to FIG. 6C, item 630 demonstrates that non radial, non elliptical and non circular insert shapes could be defined. As shown in item 630, rectilinear shapes may be formed, or as in item 640 of FIG. 6D other polygonal shapes. In a three dimensional perspective pyramids, cones and other geometrical shapes could result from the different shapes of the individual layer pieces used to form the insert. In a more general sense it may be apparent to one skilled in the arts that a vast diversity of shapes may be formed into shapes and products to make o discuss the more general case of shapes that can be made with the functionality, energization, activation etc.

CONCLUSION

The present invention, as described above and as further defined by the claims below, provides devices and methods for stacked functional layer inserts and apparatus for implementing such methods, as well as ophthalmic lenses formed including the stacked layers.

The invention claimed is:

1. A media substrate for an ophthalmic lens, the media substrate comprising:
a plurality of functionalized silicon layers; and
an adhesive film placed between at least a portion of two of the functionalized silicon layers thereby forming a stacked feature,
wherein each of the functionalized silicon layers are in the shape of an annulus and each individually has a function of at least one of energizing, activating or controlling an ophthalmic lens, and
wherein one of the functionalized silicon layers has an external radius smaller than that of another one of the functionalized silicon layers.

2. The media substrate of claim 1 wherein:
one of the functionalized silicon layers comprises a semiconductor substrate with electronic circuitry in proximity to its surface.

3. The media substrate of claim 1 wherein:
one of the functionalized silicon layers comprises a substrate with layers comprising an electrochemical energizing component.

4. The media substrate of claim 1 wherein:
the media substrate is encapsulated in a polysilicone based polymer.

5. An ophthalmic lens comprising:
a plurality of functionalized silicon layers;
an adhesive film placed between at least a portion of two of the functionalized silicon layers thereby forming a stacked feature; and
a polymeric lens form in which the stacked feature is embedded,
wherein each of the functionalized silicon layers are in the shape of an annulus and each individually has a function of at least one of energizing, activating or controlling the ophthalmic lens, and
wherein one of the functionalized silicon layers has an external radius smaller than that of another one of the functionalized silicon layers.

6. The ophthalmic lens of claim 5 wherein:
one of the functionalized silicon layers comprises one or more electrochemical cells.

7. The ophthalmic lens of claim 6 wherein:
one of the functionalized silicon layers comprises semiconductor electronic circuitry capable of controlling electric current flow from the electrochemical cells.

8. The ophthalmic lens of claim 7 additionally comprising:
an electroactive lens component, wherein the semiconductor electronic circuitry is electrically connected to the electroactive lens component.

9. The ophthalmic lens of claim 8 additionally comprising:
a metallic layer capable of functioning as an antenna.

10. The media substrate of claim 1, wherein:
the functionalized silicon layers are stacked to have a three dimensional shape comprising a general profile of the ophthalmic lens.

11. The ophthalmic lens of claim 5, wherein:
the functionalized silicon layers are stacked to have a three dimensional shape comprising a general profile of the ophthalmic lens.

* * * * *